(12) United States Patent
Kim

(10) Patent No.: US 6,493,284 B2
(45) Date of Patent: Dec. 10, 2002

(54) SEMICONDUCTOR MEMORY DEVICE HAVING HIERARCHICAL WORDLINE STRUCTURE

(75) Inventor: Jae-Hoon Kim, Suwon (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/755,766

(22) Filed: Jan. 5, 2001

(65) Prior Publication Data

US 2001/0006236 A1 Jul. 5, 2001

(30) Foreign Application Priority Data

Jan. 5, 2000 (KR) ......................................... 2000-00303

(51) Int. Cl.$^7$ ................................................. G11C 7/00
(52) U.S. Cl. ............................. 365/230.06; 365/230.01; 365/230.03; 365/227
(58) Field of Search ....................... 365/230.01, 230.03, 365/230.06, 226, 227

(56) References Cited

U.S. PATENT DOCUMENTS

| 5,764,585 | A | | 6/1998 | Matsubara |
|---|---|---|---|---|
| 5,862,098 | A | | 1/1999 | Jeong |
| 5,875,149 | A | | 2/1999 | Oh et al. |
| 5,933,388 | A | | 8/1999 | Choi |
| 5,943,289 | A | | 8/1999 | Ahn et al. |
| 6,088,286 | A | * | 7/2000 | Yamauchi et al. ...... 365/230.06 |
| 6,163,475 | A | * | 12/2000 | Proebsting .................... 365/63 |
| 6,240,046 | B1 | * | 5/2001 | Proebsting .................. 365/233 |
| 6,333,884 | B1 | * | 12/2001 | Kato et al. .................. 365/208 |
| 2002/0027818 | A1 | * | 3/2002 | Kato et al. .................. 365/208 |

\* cited by examiner

*Primary Examiner*—Viet Q. Nguyen
(74) *Attorney, Agent, or Firm*—Marger Johnson & McCollom, P.C.

(57) ABSTRACT

A semiconductor memory device has a hierarchical or divided wordline structure wordline structure. Sub-wordline activation signals are arranged such that the number of sub-wordline drive units in memory blocks to which one sub-wordline activation signal is supplied is identical to that of sub-wordline drive units in memory blocks to which the other sub-wordline activation signal is supplied. Upon such sub-wordline activation signal arrangement, power consumption is not imbalanced when each of the sub-wordline activation signals has high level of a boosting voltage.

8 Claims, 6 Drawing Sheets

SEMICONDUCTOR MEMORY DEVICE HAVING HIERARCHICAL WORDLINE STRUCTURE

This application relies for priority upon Korean Patent Application No. 2000-00303, filed on Jan. 5, 2000, the contents of which are herein incorporated by reference in their entirety.

FIELD OF THE INVENTION

The present invention relates to semiconductor integrated circuits, and more particularly to a random access memory device constructed with divided, or hierarchical, wordlines.

BACKGROUND OF THE INVENTION

A plurality of wordlines arranged in a semiconductor memory is conducted under the control of row decoders. A smaller space resulting from higher integration of the memory device makes it difficult to layout one decoder unit for one wordline. For this reason, in most semiconductor memory devices, there have recently been used a hierarchical wordline structure where a plurality of hierarchical wordline drive circuits share one output of the row decoder and are incorporated with sub-row decoders to select last one of the wordlines.

The hierarchical wordline structure is exemplarily disclosed in U.S. Pat. No. 5,764,585 entitled "SEMICONDUCTOR MEMORY DEVICE HAVING MAIN WORDLINES AND SUB-WORDLINE"; U.S. Pat. No. 5,875,149 entitled "WORDLINE DRIVER FOR SEMICONDUCTOR MEMORIES", U.S. Pat. No. 5,862,098 entitled "WORDLINE DRIVER CIRCUIT FOR SEMICONDUCTOR MEMORY DEVICE", U.S. Pat. No. 5,933,388 entitled "SUB-ROW DECODER CIRCUIT FOR SEMICONDUCTOR MEMORY DEVICE", and U.S. Pat. No. 5,943,289 entitled "HIERARCHICAL WORDLINE STRUCTURE".

Referring to prior art FIG. 1, a semiconductor memory device formed on a semiconductor chip 1 includes four memory blocks, also referred to as array blocks, MB1, MB2, MB3, and MB4. Each of MB1, MB2, MB3, and MB4 includes a plurality of memory cells. In a 4-bit structure, a 1-bit memory cell is selected in each of MB1, MB2, MB3, and MB4 during a normal operation. And then, data is written/read out to/from the selected memory cell. Predecoders, input buffers, and output buffers are arranged in peripheral circuitry that is located in a center of the semiconductor chip 1. That is, the peripheral circuitry is located in the regions spaced between blocks MB1 and MB3, and MB2 and MB4.

Each of the memory blocks MB1, MB2, MB3, and MB4 is composed of one or more sub-array blocks each including memory cells in which rows and columns are arranged, sub-wordlines arranged along the rows, and bitlines arranged along the columns. In FIG. 2, one of sub-array blocks is schematically illustrated. Three sub-wordline drive units (SWD) 10, 12, and 14 and two sub-arrays 16 and 18 are provided to a sub-array block. The sub-array 16 is arranged between the sub-wordline drive units 10 and 12. And, the sub-array 18 is arranged between sub-wordline drive units 12 and 14.

In the sub-array 16, only four sub-wordlines SWL0, SWL1, SWL2, and SWL3 corresponding to one main wordline MWL0 are illustrated. SWL0 and SWL2 of the sub-array 16 are coupled to the sub-wordline drive unit 12. SWL1 and SWL3 of the sub-array 16 are coupled to the sub-wordline drive unit 10. Similarly, SWL0 and SWL2 of the sub-array 18 are coupled to the sub-wordline drive unit 12. SWL1 and SWL3 of the sub-array 18 are coupled to the sub-wordline drive unit 14. A sub-wordline drivers 20, corresponding to sub-wordlines respectively, are provided to the sub-wordline drive units 10, 12, and 14. The sub-wordline drivers 20 are commonly coupled to one main wordline MWL0.

With reference to FIG. 2, through a driver 22a, a sub-wordline activation signal, also referred to as "sub-wordline booting signal", PX0 is applied to one of two sub-wordline drivers 20 that are provided to the sub-wordline drive unit 10. Through a driver 22b, a sub-wordline activation signal PX2 is applied to the other driver 20. Through the driver 22a, a sub-wordline activation signal PX1 is applied to one of two sub-wordline drivers 20 that are provided to the sub-wordline drive unit 12. Through the driver 22b, a sub-wordline activation signal PX3 is applied to the other driver 20. Through the driver 22a, PX0 is applied to one of two drivers 20 that are provided to the sub-wordline drive unit 14. Through the driver 22b, PX2 is applied to the other drivers 20.

The sub-wordline activation signals PX0, PX1, PX2, and PX3 are generated by the above-described sub-row decoders PXi (not shown), and have high level of a boosting voltage, Vpp, that is higher than a power supply voltage. During a normal operation, only one of the sub-wordline activation signals PXi has high level. As shown in FIG. 2, sense amplifiers are provided between areas referred to as "conjunction regions" 24 in which the drivers 22a and 22b are arranged. And, bitlines arranged in corresponding sub-arrays 16 and 18 are coupled therebetween. It is understood to those skilled in the art that the sense amplifiers are shared by adjacent sub-array (not shown). Other sub-array blocks provided to each of the memory blocks MB1, MB2, MB3, and MB4 are composed same as shown in FIG. 2.

To select a memory cell MC, designated by the box of broken lines, of the sub-array 16 that is arranged between the sub-wordline drive units 10 and 12, a main wordline MWL0 is selected and a sub-wordline activation signal PX2 has high level of a boosting voltage. At this time, other signals PX0, PX1, and PX3 have low level of a ground voltage. Other memory cells associated with the main wordline MWL0 can be selected using the same manner as described above.

Based upon such an arrangement of the sub-wordline activation signals PXi (i=0–1), power, especially boosting voltage Vpp, consumed in selecting the sub-wordline activation signal differs for each signal, resulting in power consumption imbalance on one signal. This has an influence on circuit operations such as noise, operation speed, and signal skew, among others. More specifically, a sub-wordline activation signal PX0 or PX2 is provided to two sub-wordline drive units 10 and 14 through corresponding drivers, and sub-wordline activation signal PX1 or PX3 is provided to only one sub-wordline drive unit 12 through corresponding drivers, as shown in FIG. 2. Loading of a signal line transferring PX0 or PX2 is greater than that of a signal line transferring PX1 or PX3. Therefore, associated with MB1, MB2, MB3, and MB4, power consumed in selecting PX0 or PX2 is greater than that in electing PX1 or PX3 (see FIG. 6). As a result, power consumption imbalance causes signal skew and noise imbalance.

SUMMARY OF THE INVENTION

It is an object of the present invention to provide a semiconductor memory device, which can uniformly maintain power consumption in selecting sub-wordline activation signals, respectively.

According to an aspect of the present invention, a semiconductor memory device comprises a plurality of sub-array blocks. Each of the sub-array blocks includes a plurality of sub-arrays; a plurality of main wordlines arranged through the sub-arrays; a plurality of sub-wordlines arranged in each of the sub-arrays, corresponding to each of the main wordlines; and driving means having a plurality of sub-wordline drive units. Each of the sub-wordline drive units drives one of the sub-wordlines in each of the sub-arrays corresponding to a selected main wordline in response to sub-wordline activation signals. The sub-wordline activation signals are irregularly arranged in the sub-wordline drive units of each of the sub-array blocks such that power consumption is not imbalanced when each of the sub-wordline activation signals is enabled.

Each of the sub-wordline activation signals has boosting voltage level higher than power supply voltage level when they are enabled. The plural sub-wordline drive units include first, second, and third sub-wordline drive units. The plural sub-arrays in each of the sub-array blocks includes a first sub-array arranged between the first and second sub-wordline drive units, and a second sub-array arranged between the second and third sub-wordline drive units.

The sub-wordline activation signals include first, second, third, and fourth sub-wordline activation signals. In each of a first group of sub-array blocks, the first and third sub-wordline activation signals are supplied to the first and third word-wordline drive units, and the second and fourth sub-wordline activation signals are supplied to the second sub-wordline drive unit. In each of a second group of sub-array blocks, the second and fourth sub-wordline activation signals are supplied to the first and third sub-wordline drive units, and the first and third sub-wordline activation signals are supplied to the second sub-wordline drive unit.

The plural sub-array blocks are divided into first and second memory blocks. In each of the sub-array blocks of the first memory block, the first and third sub-wordline activation signals are supplied to the first and third sub-wordline drive units, and the second and fourth sub-wordline activation signals are supplied to the second sub-wordline drive unit. In each of the sub-array blocks of the second memory block, the second and fourth sub-wordline activation signals are supplied to the first and third subs-wordline drive units, and the first and third sub-wordline activation signals are supplied to the second sub-wordline drive unit.

The plural sub-array blocks are divided into first, second, third, and fourth memory blocks. The first and third memory blocks are arranged over a central area of the semiconductor memory device, and the second and fourth memory blocks are arranged under the central area thereof. In each of the sub-array blocks of the first and second memory blocks, the first and third sub-wordline activation signals are supplied to the first and third sub-wordline drive units, and the second and fourth sub-wordline activation signals are supplied to the second sub-wordline drive unit. In each of the sub-array blocks of the third and fourth memory blocks, the second and fourth sub-wordline enables signals are supplied to the first and third sub-wordline drive units, and the first and third sub-wordline activation signals are supplied to the second sub-wordline drive unit.

In each of the sub-array blocks of the first and third memory blocks, the first and third sub-wordline activation signals are supplied to the first and third sub-wordline drive units, and the second and fourth sub-wordline activation signals are supplied to the second sub-wordline drive unit. In each of the sub-array blocks of the second and fourth memory blocks, the second and fourth sub-wordline activation signals are supplied to the first and third sub-wordline drive units, and the first and third sub-wordline activation signals are supplied to the second sub-wordline drive unit.

BRIEF DESCRIPTION OF THE DRAWINGS

The accompanying drawings, which are included to provide a further understanding of the present invention and are incorporated in and constitute a part of this specification, illustrate embodiments of the invention and together with the description serve to explain the principles of the invention. In the drawings.

DESCRIPTION OF THE PREFERRED EMBODIMENT

Upon the arrangement of sub-wordline activation signals applied to a semiconductor memory device of this invention, the number of sub-wordline drive units SWD in memory blocks to which one sub-wordline activation signal (e.g., PX0 or PX2) is supplied is equal to that of sub-wordline drive units SWD in memory blocks to which other sub-wordline activation signals (e.g., PX1 or PX3) are supplied. This means that power consumption is not imbalanced when each sub-wordline activation signal PXi (i=0–3) has high level of a booting voltage Vpp. Therefore, it is possible to prevent problems such as signal skew, noise imbalance, and difficulty in optimizing signal race, which are caused by imbalance of power consumption.

[First Embodiment]

Figure 1:
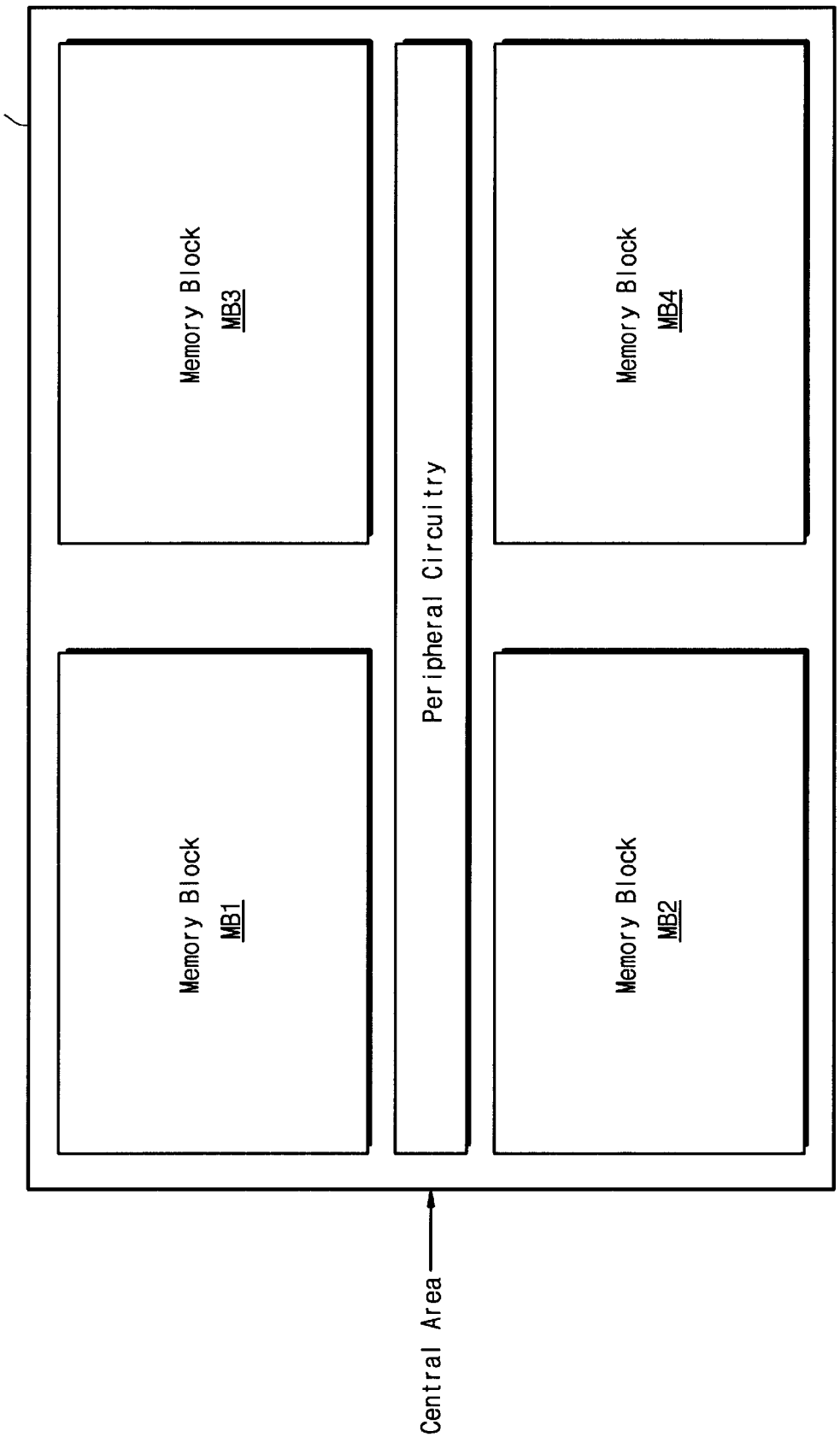
FIG. 1 is a block diagram showing a chip layout of a semiconductor memory device in accordance with a prior art.
Figure 2:
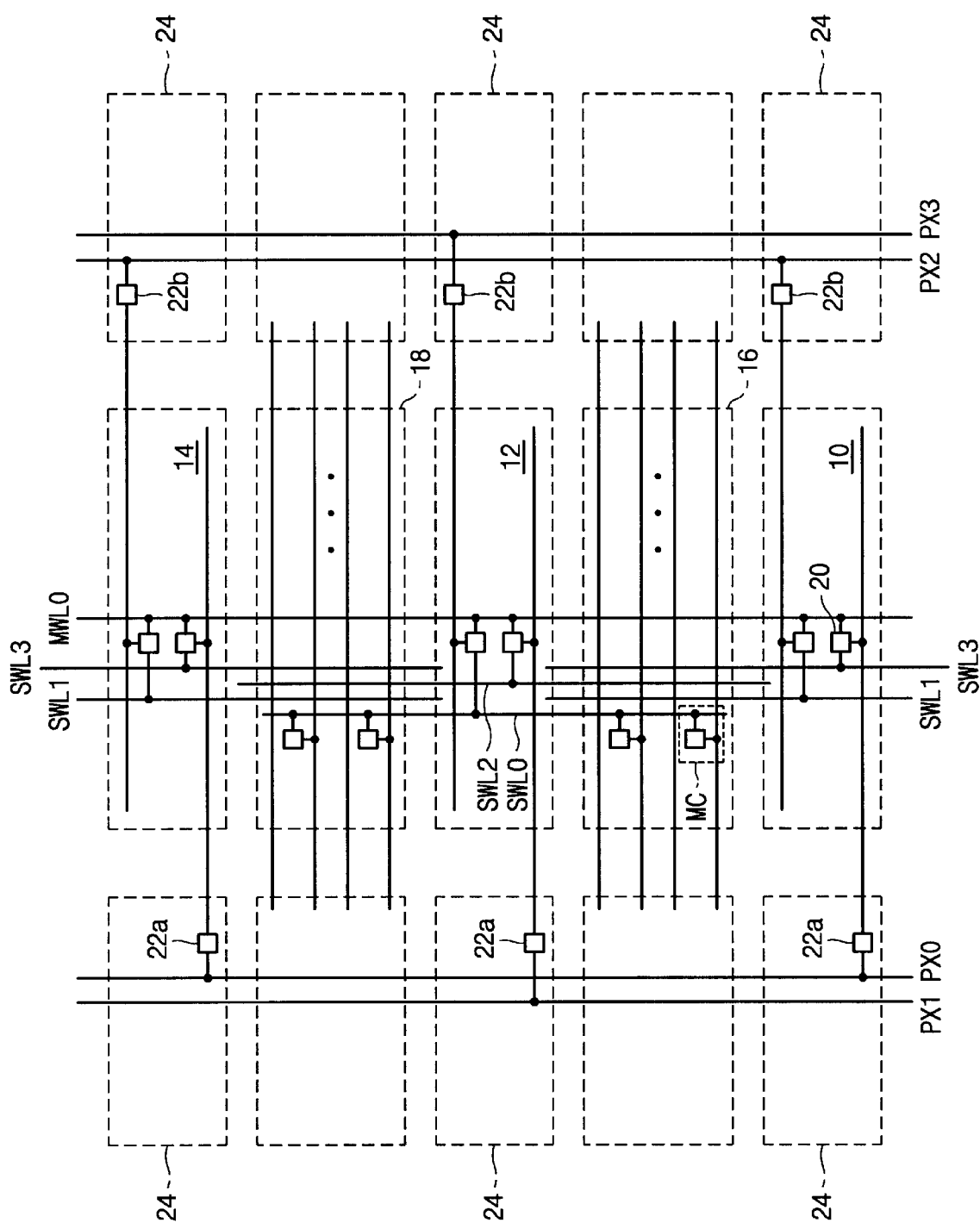
FIG. 2 is a block diagram showing one of sub-array blocks that are provided to memory blocks shown in FIG. 1, respectively.
Figure 3:
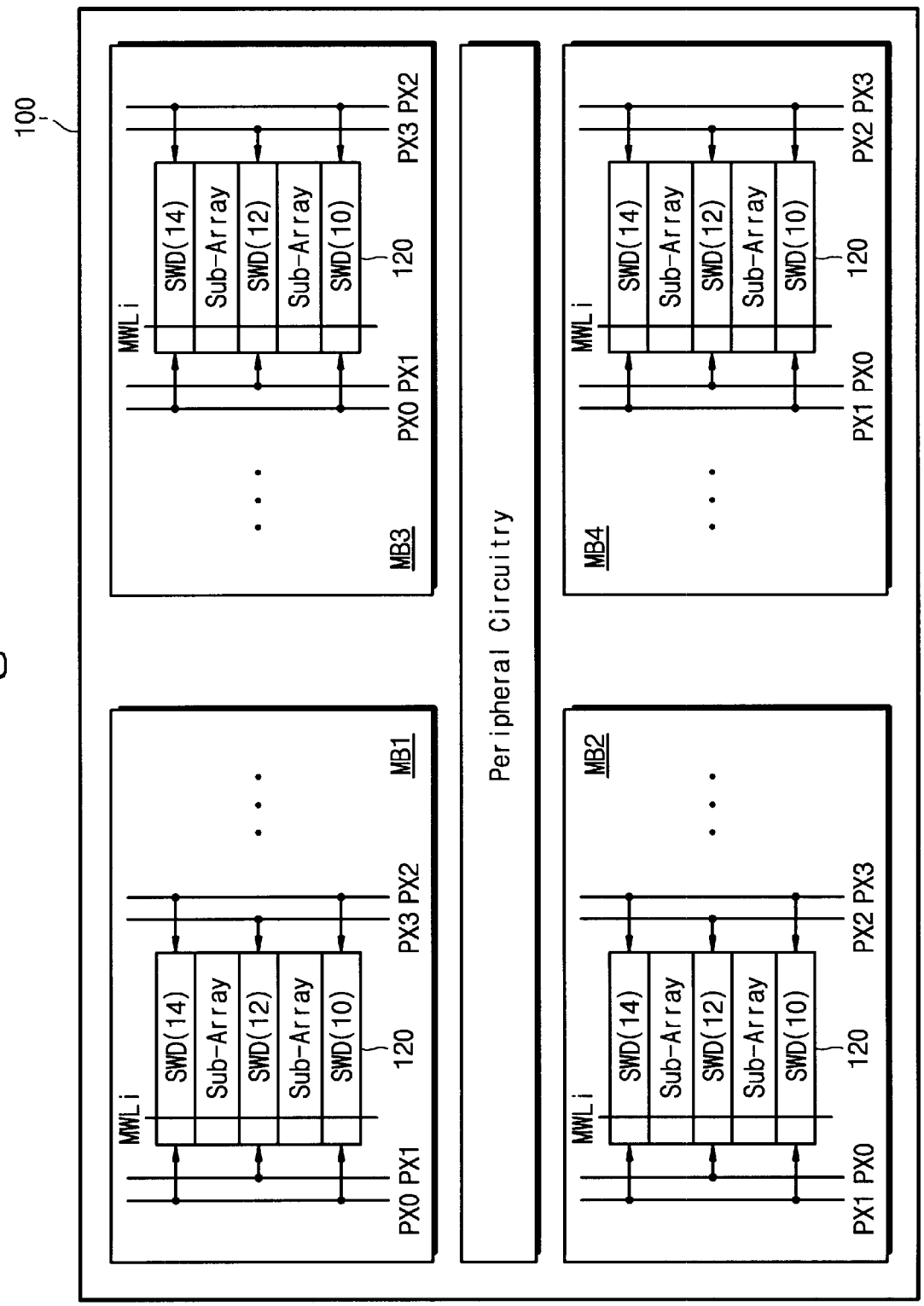
FIG. 3 is a block diagram showing arrangement of sub-wordline activation signals in accordance with a first preferred embodiment of the present invention.

Referring now to FIG. 3, a semiconductor memory device formed on a semiconductor chip 100 includes four memory blocks MB1, MB2, MB3, and MB4. Each of MB1, MB2, MB3, and MB4 are divided into a plurality of sub-array blocks 120. Each of the sub-array blocks 120 is composed of two sub-wordline drive units 10 and 12 that are adjacent each other, and two sub-arrays that are arranged between the units 10 and 12, respectively. The blocks 120 are composed same as shown in FIG. 2, so that description thereof is skipped herein. Hereafter, the blocks MB1, MB2, MB3, and MB4 are referred to as first, second, third, and fourth memory blocks, respectively.

The sub-wordline activation signals PXi arranged in the blocks 120 composing MB1 and MB3 are different from those arranged in the blocks 120 composing MB2 and MB4.

Generally, the arrangements where the activation signals are different in one block or sub-array block than in at least one other block or sub-array block will be referred to as 'irregularly arranged.' Specifically, PX0 and PX2 are applied to the sub-wordline drive units 10 and 14 of MB1 and MB3, and PX1 and PX3 are applied to the sub-wordline drive unit 12. On the other hand, PX1 and PX3 are applied to the units 10 and 14 of MB2 and MB4, and PX0 and PX2 are applied to the unit 12.

With respect to such an arrangement with PXi as mentioned above, the sub-wordline activation signals PXi are arranged to be assigned to sub-wordline drive units with the same number. For example, assuming that one sub-array block is selected in each of MB1, MB2, MB3, and MB4. PX0 or PX2 having high level of a booting voltage is applied to six sub-wordline drive units, two each in MB1 and MB3, and one each in MB2 and MB4. PX1 or PX3 having the high level of the boosting voltage is applied in a similar fashion. Therefore, when each of the sub-wordlines activation signals goes to high level, the power consumption is uniformly distributed over all the blocks. There is no inclination of power consumption at a specified block. As a result, it is possible to reduce circuital problems such as signal propagation skew, noise imbalance, and so on, arising from the imbalanced power consumption.

[Second Embodiment]

Figure 4:
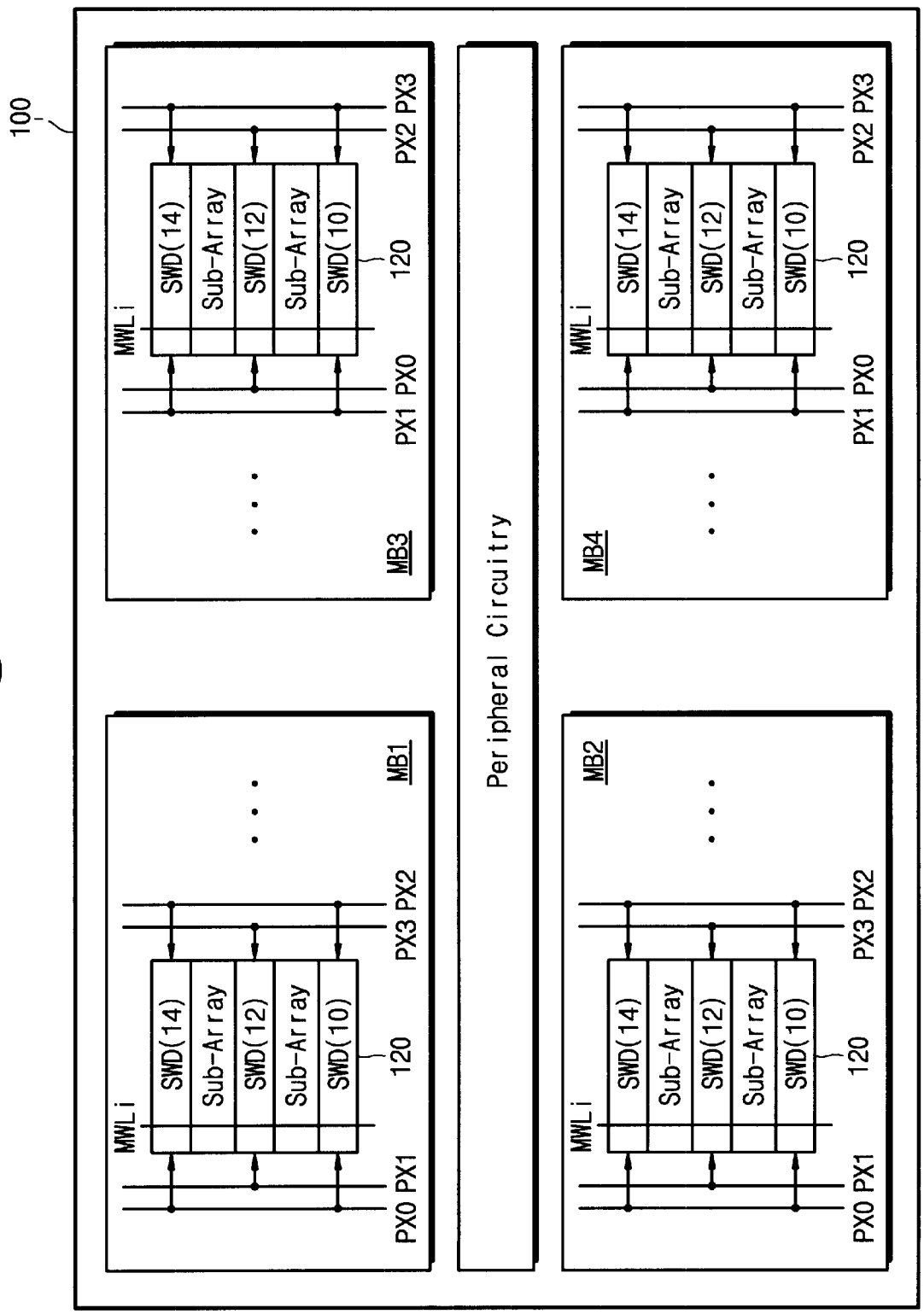
FIG. 4 is a block diagram showing arrangement of sub-wordline activation signals in accordance with a second preferred embodiment of the present invention.

Referring now to FIG. 4, a semiconductor memory device formed on a semiconductor chip 100 includes four memory blocks MB1, MB2, MB3, and MB4. Each of MB1, MB2, MB3, and MB4 is divided into a plurality of subarray blocks 120. Each of the sub-array blocks 120 is composed of three sub-wordline drive units SWD 10, 12, and 14, two sub-wordline drive units 10 and 12 that are adjacent to each other, and two sub-arrays that are arranged between the units 12 and 14, respectively. The blocks 120 of MB1, MB2, MB3, and MB4 are composed same as shown in FIG. 2, so that description thereof is skipped herein. Hereafter, MB1, MB2, MB3, and MB4 are referred to as first, second, third, and fourth memory blocks, respectively.

Sub-wordline activation signals PXi arranged in sub-array blocks 120 composing MB1 and MB2 are different from those arranged in sub-array blocks 120 composing MB3 and MB4. That is, PXi arrangement shown in FIG. 2 is regular while that of the second embodiment is irregular. Specifically, in MB1 and MB2 sub-wordline activation signals PX0 and PX2 are applied to sub-wordline drive units 10 and 14, and sub-wordline activation signals PX1 and PX3 are applied to sub-wordline drive unit 12. On the other hand, PX1 and PX3 are applied to the units 10 and 14, and PX0 and PX2 are applied to the units 12, in MB3 and MB4.

With respect to such an arrangement with PXi, sub-wordline activation signals PXi are arranged to be provided into sub-wordline drive units with the same number. For example, assuming that one sub-array block is selected in each of MB1, MB2, MB3, and MB4. PX0 or PX2 having high level of a boosting voltage is applied to six sub-wordline drive units, and PX1 or PX3 having the high level of a boosting voltage is applied thereto.

[Third Embodiment]

Figure 5:
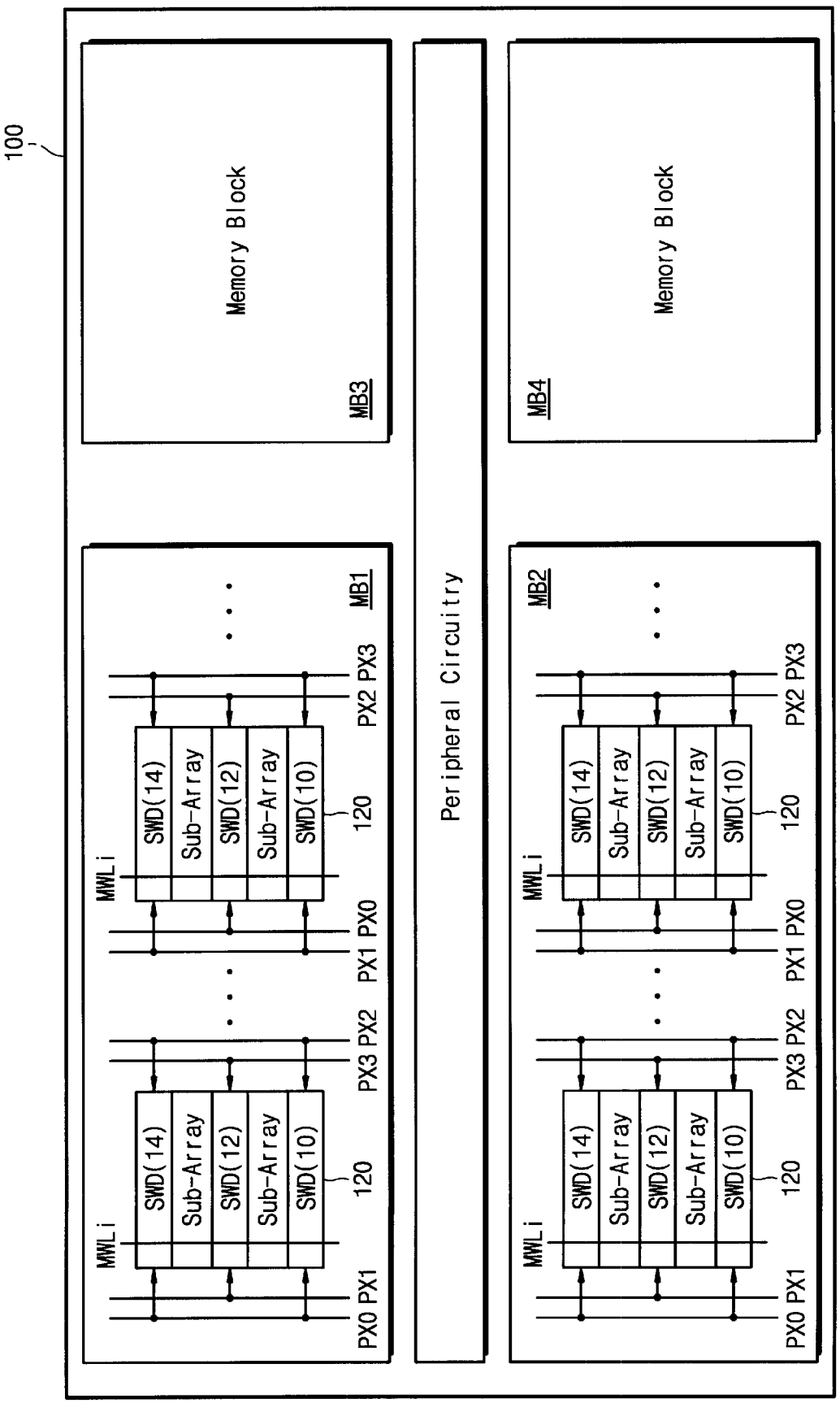
FIG. 5 is a block diagram showing arrangement of a sub-wordline activation signals in accordance with a third preferred embodiment of the present invention.

Referring now to FIG. 5, a semiconductor memory device formed on a semiconductor chip 100 includes four memory blocks MB1, MB2, MB3, and MB4. Each of MB1, MB2, MB3, and MB4 is divided into a plurality of sub-array blocks 120. Each of the sub-array blocks 120 is composed of three sub-wordline drive units SWD 10, 12, and 14, two sub-wordline drive units 10 and 12 that are adjacent to each other, and two sub-arrays that are arranged between the units 12 and 14, respectively. The blocks 120 of MB1, MB2, MB3, and MB4 are composed same as shown in FIG. 2, so that description thereof is skipped herein. Hereafter, MB1, MB2, MB3, and MB4 are referred to as first, second, third, and fourth memory blocks, respectively.

Since arrangements of MB1, MB2, MB3, and MB4 are identical to one another, the third embodiment will be described using MB1.

The sub-array blocks 120 composing MB1 is divided into a first group of sub-array blocks and a second group of array blocks. The array blocks of the first group have the identical PXi arrangement one another. Similarly, the array blocks of the second group have the identical PXi arrangement one another. On the other hand, the sub-array blocks of the first group and the sub-array blocks of the second group have different PXi arrangement one another such that power consumption is identical in each sub-array block, meaning power consumptions is balanced, when each of the sub-wordline activation signals PXi goes to high level. The sub-array blocks of the first group may be composed of odd-numbered sub-array blocks in each memory block or a half of sub-array blocks in each memory block. And, the sub-array blocks of the second group may be composed of even-numbered sub-array blocks in each memory block or a half of sub-array blocks in each memory block. It is understood to those skilled in the art that the sub-array blocks of the first and second groups may be composed by means of other manners.

PX0 and PX2 are applied to the units 10 and 14 in the sub-array blocks 120 of the first group, respectively. PX1 and PX3 are applied to the unit 12 in the sub-array blocks 120 of the first group, respectively. On the other hand, PX1 and PX3 are applied to the units 10 and 14 in the sub-array blocks 120 of the second group, respectively. PX0 and PX2 are applied to the unit 12 in the sub-array blocks 120 of the second group, respectively. Similarly, the other blocks MB2, MB3, and MB4 are composed same as the above block MB1 is composed.

Upon the foregoing PXi arrangement, each of the sub-wordline activation signals PXi is arranged, being supplied to the sub-wordline drive units in the same number. For example, assuming that one of the sub-array blocks of the first group and one of the sub-array blocks of the second group are selected in each of the memory blocks MB1, MB2, MB3, and MB4. PX0 or PX2 having high level of a boosting voltage is applied to 12 sub-wordline drive units, three sub-wordline drive units per each sub-array block, as shown in FIG. 5. Similarly, PX1 or PX3 having high level of a boosting voltage is applied to 12 sub-wordline drive units, three sub-wordline drive units per each sub-array block, as shown in FIG. 5.

Figure 6:
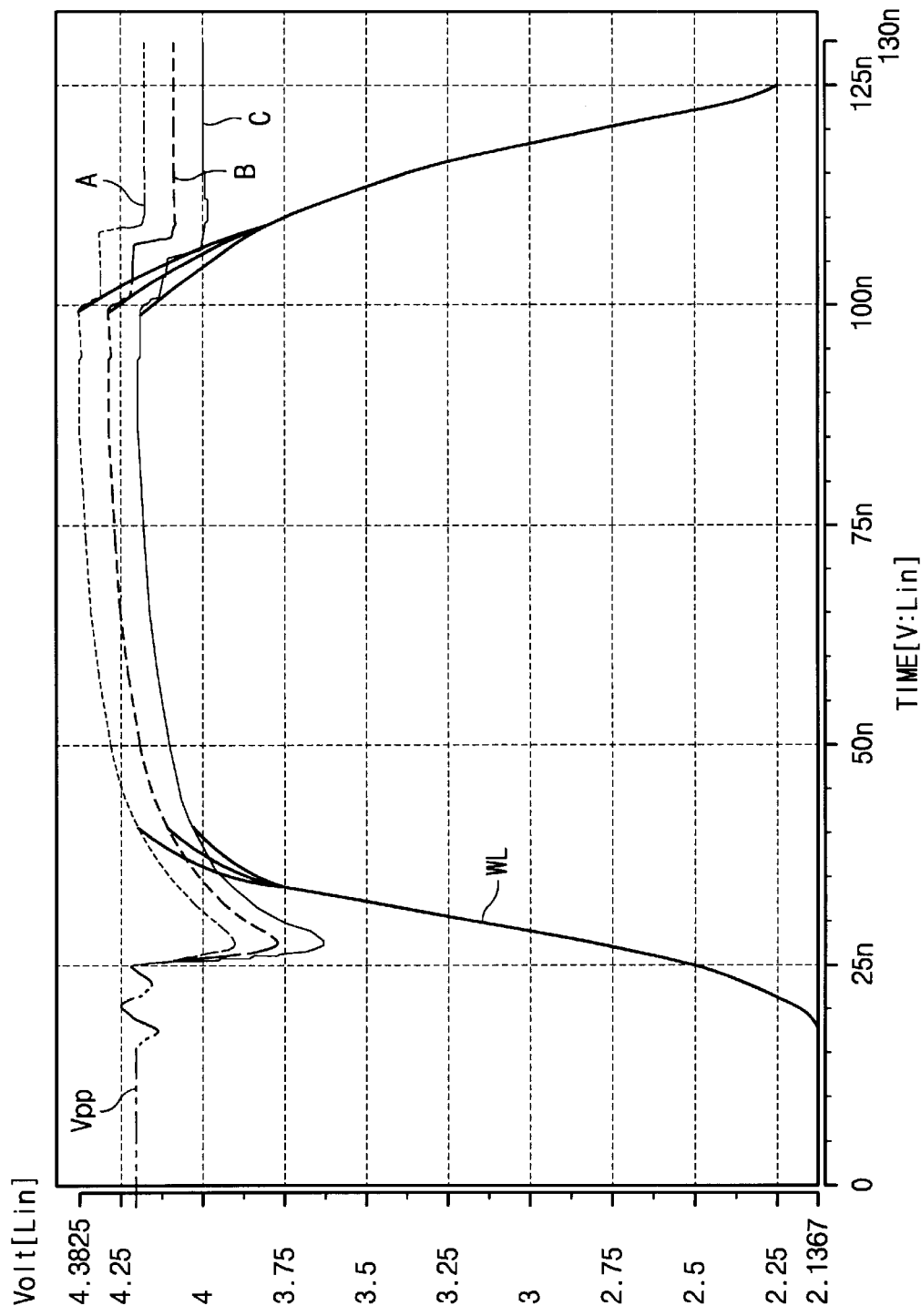
FIG. 6 is a graph for comparing power consumption in accordance with a prior art with that in accordance with the present invention.

Referring now to FIG. 6, curves referred by numerals A and C denote power consumption, especially the boosting voltage Vpp, based upon a regular PXi arrangement in accordance with a prior art. A curve line referred by numeral B denotes power consumption based upon an irregular PXi arrangement in accordance with the present invention. In the prior art, the number of sub-wordline drive units to which sub-wordline activation signals PX0 and PX2 are supplied is larger than that of sub-wordline drive units to which sub-wordline activation signals PX1 and PX3 are supplied. This results in imbalance of power consumption on the memory blocks. The curve C corresponds to the former while the dotted line displayed by the symbol A corresponds to the latter. Thus, it can be shown that the power consumption is imbalanced in case of the former. The imbalance of the power consumption causes a decrease of a boosting voltage Vpp or wordline voltage that will be used in the next cycle (i.e., Vpp is gradually lowered). If Vpp becomes too low, it takes long time to boost Vpp up to a required level. In reverse, the size of a boosting circuit must be increased so as to boost Vpp up to the required level in a predetermined time. In case of the latter, the boosting voltage is gradually boosted up owing to the imbalance of the power consumption, as can be seen in FIG. 6.

Upon the PXi arrangement in accordance with the invention, the loading of signal lines for transferring sub-wordline activation signals PXi is identical to each other. Specifically, the loading is a capacitance to which a corresponding sub-wordline drive unit is coupled. Therefore, power consumption is substantially equally distributed over the memory blocks even when each of the sub-wordline activation signals PXi is selected, as shown by the curve B.

Although the preferred embodiments of the present invention have been described, it will be apparent to those skilled in the art that various modifications, additions, and substitutions can be made without departing from the scope and spirit of the present invention.

What is claimed is:

1. A semiconductor memory device comprising:
a plurality of sub-array blocks;
wherein each of the sub-array blocks includes a plurality of sub-arrays; a plurality of main wordlines arranged through the sub-arrays; a plurality of sub-wordlines arranged in each of the sub-arrays, corresponding to each of the main wordlines; and driving means having a plurality of sub-wordline drive units;
wherein each of the sub-wordline drive units drives one of the sub-wordlines in each of the sub-arrays corresponding to a selected main wordline in response to sub-wordline activation signals; and
wherein the sub-wordline activation signals are irregularly arranged in the sub-wordline drive units of each of the sub-array blocks such that power consumption is uniformly distributed when each of the sub-wordline activation signals is enabled.

2. The device of claim 1, wherein each of the sub-wordline activation signals has boosting voltage level higher than power supply voltage level when they are enabled.

3. The device of claim 1, wherein the plural sub-wordline drive units include first, second, and third sub-wordline drive units, and
wherein the plural sub-arrays in each of the sub-array blocks includes a first sub-array arranged between the first and second sub-wordline drive units, and a second sub-array arranged between the second and third sub-wordline drive units.

4. The device of claim 3, wherein the sub-wordline activation signals include first, second, third, and fourth sub-wordline activation signals,
wherein, in each of a first group of sub-array blocks, the first and third sub-wordline activation signals are supplied to the first and third word-wordline drive units, and the second and fourth sub-wordline activation signals are supplied to the second sub-wordline drive unit, and wherein, in each of a second group of sub-array blocks, the second and fourth sub-wordline activation signals are supplied to the first and third sub-wordline drive units, and the first and third sub-wordline activation signals are supplied to the second sub-wordline drive unit.

5. The device of claim 3, wherein the plural sub-array blocks are divided into first and second memory blocks,
wherein, in each of the sub-array blocks of the first memory block, the first and third sub-wordline activation signals are supplied to the first and third sub-wordline drive units, and the second and fourth sub-wordline activation signals are supplied to the second sub-wordline drive unit, and
wherein, in each of the sub-array blocks of the second memory block, the second and fourth sub-wordline activation signals are supplied to the first and third subs-wordline drive units, and the first and third sub-wordline activation signals are supplied to the second sub-wordline drive unit.

6. The device of claim 3, wherein the plural sub-array blocks are divided into first, second, third, and fourth memory blocks,
wherein the first and third memory blocks are arranged over a central area of the semiconductor memory device, and
wherein the second and fourth memory blocks are arranged under the central area thereof.

7. The device of claim 6, wherein, in each of the sub-array blocks of the first and second memory blocks, the first and third sub-wordline activation signals are supplied to the first and third sub-wordline drive units, and the second and fourth sub-wordline activation signals are supplied to the second sub-wordline drive unit, and
wherein, in each of the sub-array blocks of the third and fourth memory blocks, the second and fourth sub-wordline enables signals are supplied to the first and third sub-wordline drive units, and the first and third sub-wordline activation signals are supplied to the second sub-wordline drive unit.

8. The device of claim 6, wherein, in each of the sub-array blocks of the first and third memory blocks, the first and third sub-wordline activation signals are supplied to the first and third sub-wordline drive units, and the second and fourth sub-wordline activation signals are supplied to the second sub-wordline drive unit, and
wherein, in each of the sub-array blocks of the second and fourth memory blocks, the second and fourth sub-wordline activation signals are supplied to the first and third sub-wordline drive units, and the first and third sub-wordline activation signals are supplied to the second sub-wordline drive unit.

* * * * *